United States Patent [19]

Hundt

[11] 4,187,431
[45] Feb. 5, 1980

[54] METHOD FOR THE ADJUSTMENT OF A SEMICONDUCTOR DISC RELATIVE TO A RADIATION MASK IN X-RAY PHOTOLITHOGRAPHY

[75] Inventor: Eckart Hundt, Haar, Fed. Rep. of Germany

[73] Assignee: Siemens Aktiengesellschaft, Berlin & Munich, Fed. Rep. of Germany

[21] Appl. No.: 904,597

[22] Filed: May 10, 1978

[30] Foreign Application Priority Data

May 26, 1977 [DE] Fed. Rep. of Germany ....... 2723902

[51] Int. Cl.² .............................................. G02B 27/00
[52] U.S. Cl. .................................. 250/492 A; 29/578;
29/579; 250/272
[58] Field of Search ............. 250/492 A, 272; 29/578, 29/579

[56] References Cited

U.S. PATENT DOCUMENTS

| | | | |
|---|---|---|---|
| 3,742,229 | 6/1973 | Smith et al. ...................... | 250/492 A |
| 3,928,094 | 12/1975 | Angell ..................................... | 29/578 |
| 3,984,680 | 10/1976 | Smith ..................................... | 250/272 |

OTHER PUBLICATIONS

Spears et al., "X-Ray Lithography-A New High Resolution Replication Process", Solid State Technology, Jul. 1972, pp. 21-26

*Primary Examiner*—Alfred E. Smith
*Assistant Examiner*—T. N. Grigsby
*Attorney, Agent, or Firm*—Hill, Van Santen, Steadman, Chiara & Simpson

[57] ABSTRACT

In an illustrative embodiment marks with dual x-ray permeable apertures are at three spaced locations on the mask and transmit x-ray beams which are directed obliquely to the semiconductor surface. In this case, the marks on the semiconductor disc may be formed by monocrystals shaped in conformity with the incident beam cross section and located so as to produce reflected x-ray beams which intersect correspondingly shaped further apertures of the respective dual aperture marks on the mask. Alternatively the beams may impinge on the surface of the semiconductor disc itself at an angle to produce reflection, with x-ray absorbing material surrounding each reflecting region. In either case the reflected beams as transmitted by the further apertures are detected as a measure of the degree of parallelism of the mask and semiconductor disc.

6 Claims, 5 Drawing Figures

METHOD FOR THE ADJUSTMENT OF A SEMICONDUCTOR DISC RELATIVE TO A RADIATION MASK IN X-RAY PHOTOLITHOGRAPHY

BACKGROUND OF THE INVENTION

The invention relates to a method for the adjustment of a semiconductor disc relative to a radiation mask in x-ray photolithography as specified in detail in the preamble of main claim 1.

In the semiconductor technolgy photolithographic processes are applied in the fabrication of semiconductor components and integrated circuits where structures of a radiation mask are transmitted to a radiation-sensitive lacquer layer on a semiconductor disc. In the entire fabrication process it is necessary to cause a plurality of layers of structures to be matched. That is why in the different exposure phases the semiconductor disc must be adjusted very precisely against the prevailing mask. Thereby the error in the adjustment of the masks relative to the semiconductor discs must be smaller than the smallest structure to be produced in the semiconductor disc. Under the present fabrication procedure for integrated circuits the transmission of the structure in most cases is accomplished by light optical methods. The adjustment is carried out by the simultaneous observation of two pairs of adjustment marks, with the one pair of adjustment marks being located on the mask and the other one of the semiconductor disc. However, for very precise adjustments in the area of 0.5 micron, the borderline of the resolving power of the ordinary light-optical microscopes is reached.

In x-ray photolithography a varnish sensitive to x-rays and x-ray radiation for the picturing of the mask is used. Based on the short wavelength the phenomena of diffraction are reduced in this type of projection, so that the structural dimensions which can be projected are substantially smaller than in case of projection with visible light. That is why with x-ray photolithography an adjustment with a precision of about 0.1 micron must be attained.

Under the conventional adjustment with an optical microscope first the mask and the semiconductor disc are pressed on each other in order to align the semiconductor disc parallel with the mask, the so-called compensation of the wedging error. Due to surface roughness of the semiconductor disc the mask can thereby be destroyed easily.

With the actual adjustment process, depending on the definition in depth, a small distance is maintained between mask and semiconductor disc. Due to surface roughnesses of the semiconductor disc, however, there the mask again can be destroyed very easily. This is an important reason for a poor yield in the fabrication of semiconductors.

Additional difficulties can occur in an adjustment system used for x-ray photolithography, in that the material of the support on which the structures of the exposure mask to be adjusted either are opaque or only very weakly translucent, so that in view of this fact a simultaneous sharp focusing of the adjustment microscope on the adjustment mark of the mask and on the adjustment marks of the semiconductor disc is complicated.

An adjustment method for x-ray photolithography is known from Solid State Technology (July, 1972), pages 21–26, where the adjustment is made with the aid of x-rays. For that purpose adjustment marks of material absorbing x-rays are applied in each case to the semiconductor disc and to the radiation mask. After the x-rays have penetrated these adjustment marks, the intensity of the radiation is read with the aid of a detector and depending on the shaping of both adjustment marks, an adjustment is effected to provide a radiation maximum or radiation minimum in the detector.

In this method known from prior art it is disadvantageous that no possibility exists for a control of the mutual spacing of semiconductor disc and adjustment mark. For a parallel adjustment of semiconductor disc and radiation mask, this method too requires semiconductor disc and radiation mask to be pressed against each other.

SUMMARY OF THE INVENTION

The invention is based on the problem of disclosing a method for the adjustment of a semiconductor disc relative to a radiation mask in x-ray photolithography where x-ray radiation is used for the adjustment and where a parallel alignment of semiconductor disc and radiation mask is made possible without the necessity of pressing the radiation mask and the semiconductor disc against each other.

This problem is solved in a method according to the invention as indicated in the preamble of main claim 1 in the manner recited in the characterizing part of main claim 1.

The invention provides for the carrying out of the adjustment with the aid of an x-ray beam which penetrates for example an adjustment mark on the exposure mask and impinges on a reflecting adjustment mark of the semiconductor disc and which is directed from the reflecting adjustment mark of the semiconductor disc into an x-ray detector. If in this case the semiconductor disc is not at the theoretic distance from the radiation mask, the x-ray beam will not impinge on the reflecting adjustment mark, so that in this case no x-ray radiation arrives in the detector. For the adjustment the distance between the semiconductor disc and the radiation mask is modified, so that the x-ray radiation falling into the detector is maximized. However, the adjustment also may be carried out in the reversed manner, by applying the reflected adjustment mark on the radiation mask, so that the x-ray beam used for the adjustment first penetrates the semiconductor disc and an adjustment mark applied thereon, then impinges on the reflecting adjustment mark of the radiation mask and from there it will arrive in the detector.

An x-ray beam is used for the adjustment which is inclined in relation to the normal surface line of the semiconductor disc and/or the radiation mask, since then the space between semiconductor disc and radiation mask can be controlled more precisely than with a beam of rays incident almost vertically on the semiconductor disc or the radiation mask. Appropriately, the semiconductor disc is shifted for the parallel adjustment of semiconductor disc and radiation mask. For that purpose the reflecting adjustment mark is applied to the semiconductor disc. In that case it is necessary to have a beam of x-rays incident on the semiconductor disc at such an angle where at the crystal lattice of the semiconductor disc a reflection of the x-ray radiation occurs. A spot of the semiconductor disc surrounded by absorbent material is used in that case as adjustment mark. Insofar as no sufficiently strong reflections occur at the semiconductor disc, it also is possible to apply as adjustment mark on the semiconductor disc a crystal reflecting the x-ray radiation. The precision of adjustment can be increased by using periodic structures as adjustment marks, for example a sequence of equidistant reflecting rays on the semiconductor disc and a correspondingly resolved absorption pattern with equidistant permeable strips on the radiation mask.

The invention will be described below and explained more in detail by means of an embodiment exemplified in the accompanying sheets of drawings; and other objects, features and advantages will be apparent from this detailed disclosure and from the appended claims.

DETAILED DESCRIPTION

Figure 1:
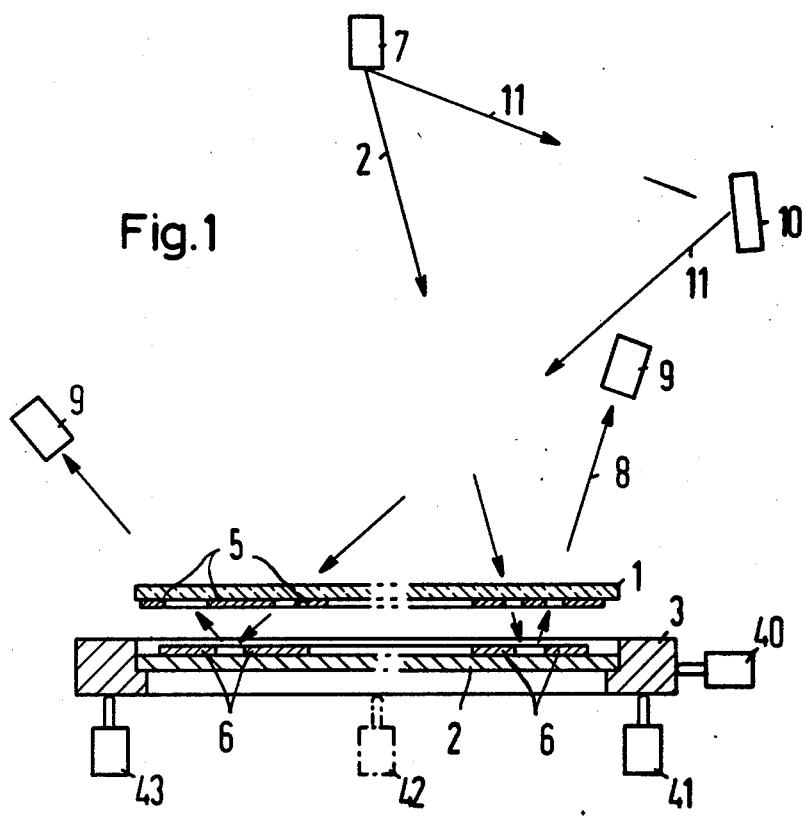
FIG. 1 schematically shows the path of rays for an embodiment of the method according to the invention.

The adjustment of the semiconductor disc and the radiation mask is accomplished for example in that the radiation mask 1 is fixedly mounted in the adjustment apparatus. The semiconductor disc 2 is clamped into a substratum holder 3. This substratum holder 3 can be moved in a horizontal direction with the aid of a shifting apparatus 40, and in a vertical direction by means of an additional number of shifting devices 41, 42, 43. With the aid of the devices 41, 42 and 43, a parallel alignment of the semiconductor disc can be accomplished parallel with the radiation mask 1. Adjustment marks 5 made of absorbent material, gold for example, and having two apertures for example, so that x-rays can pass through these apertures, are located on the radiation mask 1. Adjustment marks 6 corresponding with the adjustment marks 5 are located on the semiconductor disc 2, and these adjustment marks 6 consist of material absorbing x-rays, gold for example, and their structure is such that the material absorbing the x-rays is arranged about a free spot of the semiconductor disc. The adjustment is carried out by x-rays which discharge from an x-ray source 7. FIG. 1 shows two possible courses of rays. A beam of x-rays 8 passes through an aperture located in the adjustment mark 5 of the radiation mask 1, impinges on the semiconductor disc 2, where it is reflected, with the reflected x-rays passing through another aperture in the adjustment mark 5 of the radiation mask 1 and arriving in a detector 9. With the aid of the displacement devices 40 to 43 the semiconductor disc is shifted in such a manner that the intensity of the x-rays incident at the detector 9 becomes maximum. Insofar as the angle of incidence of the beam of rays 8 for a reflection at the semiconductor disc 2 becomes too large, it is possible to use with the aid of a diffraction crystal 10 another beam of rays 11 analogously for the adjustment. The diffraction crystal 10 thereby is arranged in such a manner that the cluster of rays 11 incident on the semiconductor disc impinges on the semiconductor disc in the angle of reflection.

FIG. 2 schematically shows how an adjustment of the distance between semiconductor disc and radiation mask can be accomplished. Equidistant strips 25 of material absorbing x-rays, gold for example, are used as adjustment marks in this radiation mask. The adjustment marks of the semiconductor disc 2 consist for example of reflection crystals 26 arranged strip-like, whereby the distance between these reflection crystals 26 is equal to the distance between the strips 25 on the radiation mask. In the event that the radiation mask is adjusted precisely both in the horizontal x-direction and in the vertical direction with reference to the radiation mask, a portion 18 of the incident beam of rays 8 is reflected with maximum intensity.

Figure 2A:
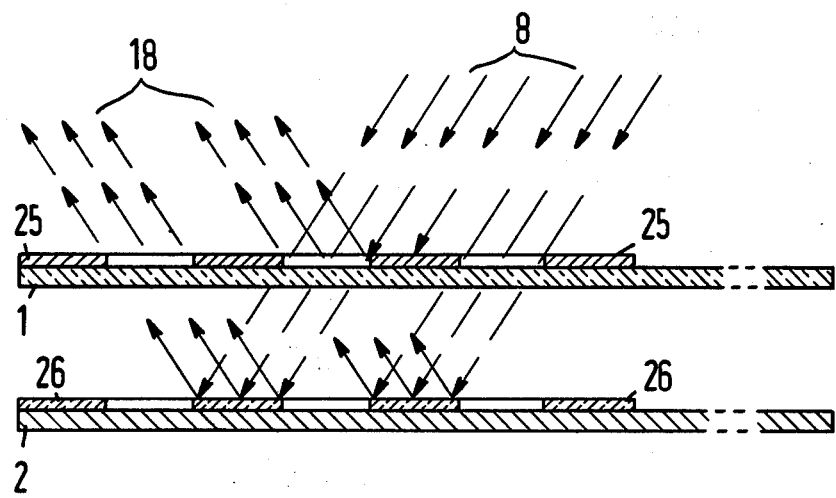
FIG. 2 (comprising FIGS. 2a and 2b) shows how with the aid of periodically designed adjustment marks the precise alignment of semiconductor disc and radiation mask is accomplished.

FIG. 2a shows the case where the semiconductor disc and the radiation mask are aligned precisely on each other.

Figure 2B:
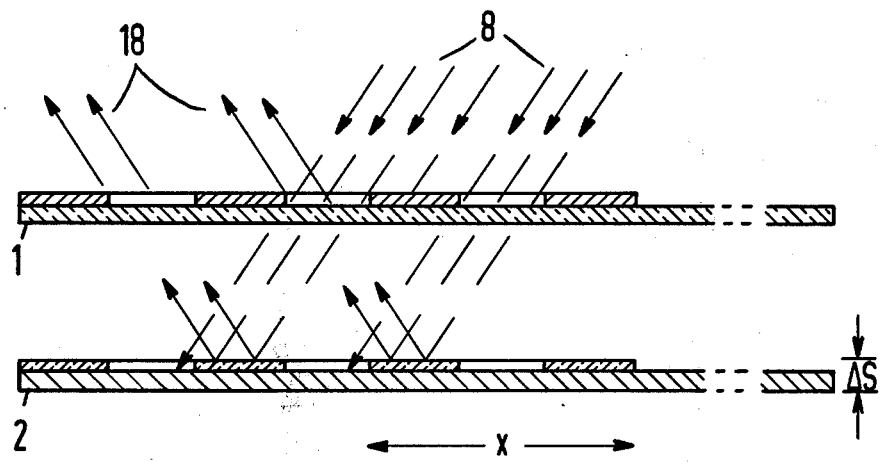

FIG. 2b schematically shows how the intensity of the reflected beam of rays decreases when the semiconductor disc 2 is shifted by a vertical distance ΔS from its theoretic position. In that case, only a portion of the x-ray beam energy passed by the adjustment marks 25 on the radiation mask impinges on corresponding reflection marks 26, while a remaining portion of the transmitted rays is no longer reflected and thus no longer reaches the detector 9.

Figure 3A:
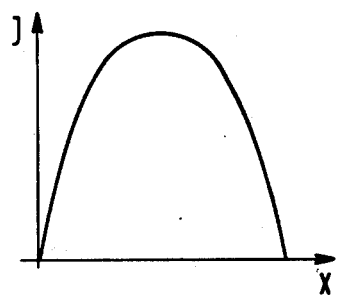
FIG. 3 (comprising FIGS. 3a and 3b) schematically demonstrates the variation of intensity of the x-ray radiation absorbed by the x-ray detectors as a function of shifting in the x-direction in FIG. 2.
Figure 3B:
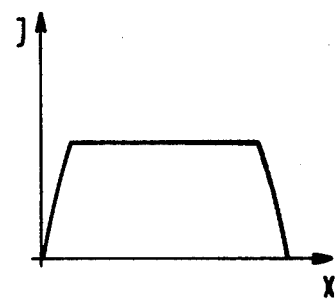

FIG. 3 represents the variation of the intensity obtained with a shifting of the semiconductor disc in the horizontal x-direction. FIG. 3a shows the course of intensity which is obtained in the case where the semiconductor disc is spaced from the radiation mark by the theoretic distance. FIG. 3b shows the course of the intensity for a shifting of the semiconductor disc in the x-direction, for which case the semiconductor disc is spaced by a vertical distance ΔS from its theoretic distance from the radiation mask.

It will be apparent that many modifications and variations may be effected without departing from the scope of the novel concepts and teachings of the present invention.

I claim as my invention:

1. A method for the adjustment of a semiconductor disc relative to a radiation mask in x-ray photolithography where in order to determine the relative positions of semiconductor disc and radiation mask the intensity of a beam of x-rays is determined which impinges on an adjustment mark on the semiconductor disc and on an adjustment mark on the radiation mark, characterized by the fact that for one of the adjustment marks (5, 6) a reflecting adjustment mark is used which reflects at least a portion of the beam of x-rays (8; 11) impinging thereon, and sensing the intensity of the reflected beam as a measure of relative position.

2. The method as defined in claim 1, characterized by the fact that the semiconductor disc (2) and the radiation mask (1) are provided in each case with three adjustment marks (5, 6) associated with each other in pairs.

3. The method as defined in claim 1 or 2, characterized by the fact that the reflecting adjustment mark is applied to the semiconductor disc (2) and that the semiconductor disc (2) is shifted for the parallel alignment of semiconductor disc (2) and radiation mask (1).

4. The method as defined in claim 3, characterized by the fact that a beam of x-rays is used which impinges on the semiconductor disc (2) at an angle such that the semiconductor disc reflects the beam.

5. The method as defined in claim 3, characterized by the fact that monocrystals (26) reflecting x-rays are applied to the semiconductor disc (2) as adjustment marks.

6. The method as defined in claim 1 or 2, characterized by using adjustment marks having a periodic structure.

* * * * *